United States Patent [19]
Aufinger et al.

[11] Patent Number: 6,069,404
[45] Date of Patent: May 30, 2000

[54] ARRANGEMENT FOR THE REDUCTION OF NOISE IN MICROWAVE TRANSISTORS AND METHOD FOR THE MANUFACTURE THEREOF

[75] Inventors: Klaus Aufinger, Ottobrunn; Herbert Knapp, Munich, both of Germany

[73] Assignee: Siemens Aktiengesellschaft, Munich, Germany

[21] Appl. No.: 09/156,202

[22] Filed: Sep. 17, 1998

[30] Foreign Application Priority Data

Sep. 17, 1997 [DE] Germany .............. 197 40 909

[51] Int. Cl.[7] .............. H01L 27/082; H01L 27/102; H01L 29/70
[52] U.S. Cl. .............. 257/728; 257/583; 257/592; 257/565
[58] Field of Search .............. 257/583, 592, 257/565, 662, 664

[56] References Cited

U.S. PATENT DOCUMENTS 5,557,139  9/1996  Palara ..................... 257/592

OTHER PUBLICATIONS

Itoh et al. ("The analysis of silicon bipolar transistor scaling-down scheme for low noise and low power analog application", Bipolar/BiCMOS Circuits and Technology Meeting, 1994, Proceedings of the 1994, 1994, pp. 60–63).

N. Camilleri, et al., IEEE 1994 Microwave and Millimeter-Wave Monolithic Circuits Symposium, Bonding Pad Models for Silicon VLSI Technologies and Their Effects on the Noise Figure of RF NPNs, WEeF–66, pp. 225–228.

M.J. Deen, et al., Canadian Journal of Physics, Modelling of Bonding Pads and Their Effect on the High Frequency Noise Figure of Polysilicon Emitter Bipolar Junction Transistors, In Press 1996.

Primary Examiner—Mahshid Saadat
Assistant Examiner—Jhihan B. Clark
Attorney, Agent, or Firm—Hill & Simpson

[57] ABSTRACT

A structure for a microwave device in which the minimum noise figure is reduced in that underneath the base terminal surface of a transistor, a highly-doped trenched layer is formed, which layer is connected to a reference potential in the vicinity of the base terminal surface via a standard collector contact.

13 Claims, 3 Drawing Sheets

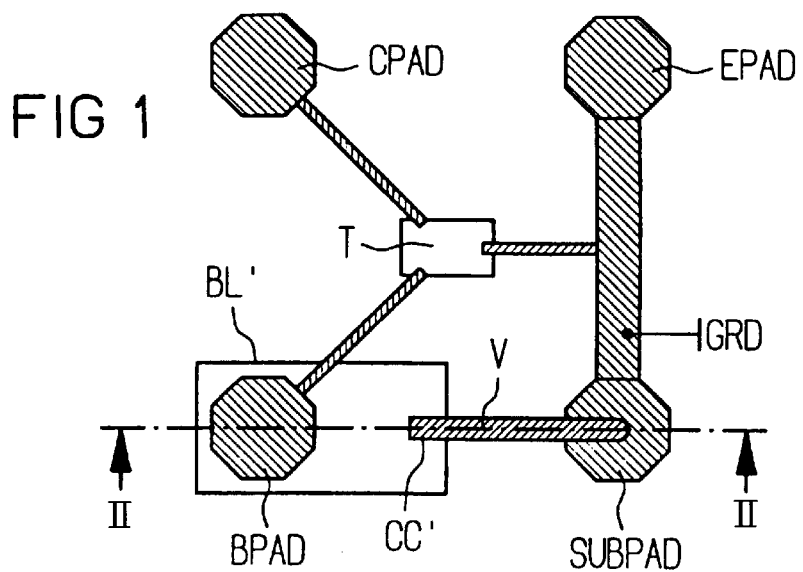
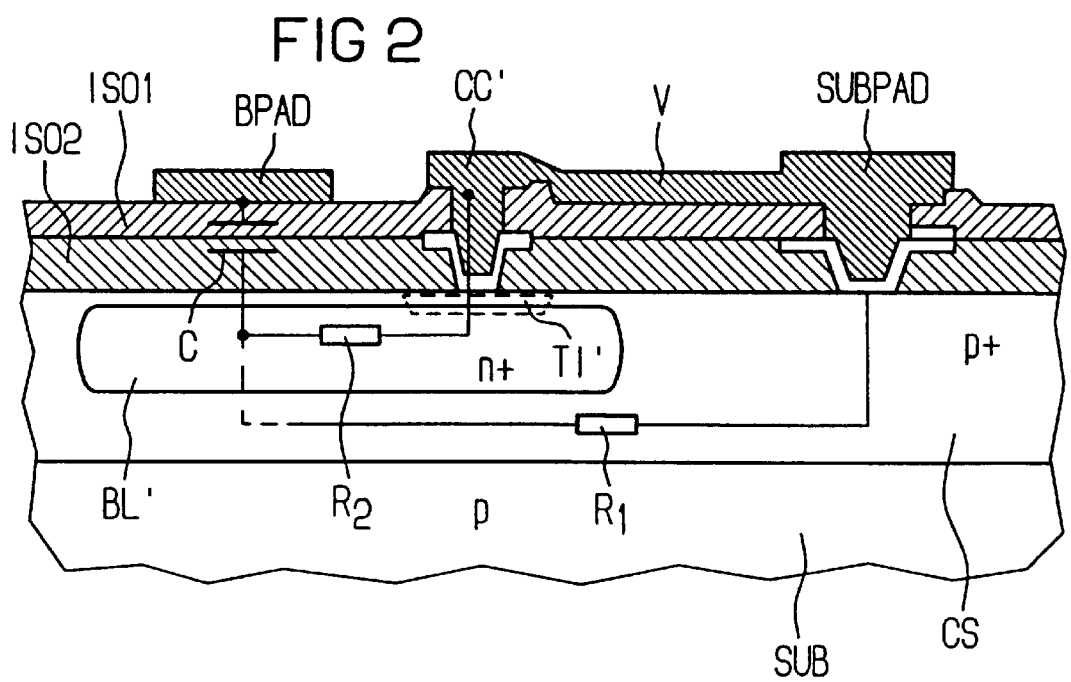

ARRANGEMENT FOR THE REDUCTION OF NOISE IN MICROWAVE TRANSISTORS AND METHOD FOR THE MANUFACTURE THEREOF

BACKGROUND OF THE INVENTION

The invention relates to microwave transistors. More particularly, this invention relates to schemes for the minimization of the noise figure in microwave transistors.

As the name indicates, the noise figure is a measure of the noise of a component. With the development of ever-smaller dimensions of the components in microwave devices and ever-higher operating frequencies in microwave systems, the noise figure is increasingly influenced by the parasitic elements on the chip, e.g. lines, contact surfaces and the substrate resistance.

From the IEEE Paper from the Microwave and Millimeter-Wave Monolithic Circuits Symposium, 1994, pp. 225 to 228, fully incorporated herein by reference, a modeling with equivalent circuit diagrams is known that shows that, for example, the parasitic effects due to the connection terminal pads have an increasingly stronger influence on the noise figure as the frequency increases.

SUMMARY OF THE INVENTION

An object of the invention is to provide an arrangement for the reduction of noise in microwave transistors in which the reduction of the noise figure of the transistor can be carried out in the simplest way possible and as far as possible without modification of standard manufacturing processes for microwave transistors in silicon bipolar technology. To this end, in an embodiment, the invention provides a microwave device, comprising a substrate; a transistor whose collector, base and emitter are respectively connected to a collector terminal surface (CPAD), a base terminal surface (BPAD) and an emitter terminal surface (EPAD); a substrate terminal surface, the emitter terminal surface being connected to the substrate terminal surface and electrical ground; and a highly doped trenched layer (BL') insulated from, but positioned underneath, the base terminal surface, the trenched layer being connected to ground via a contact (CC') located as closely as possible next to the base terminal surface.

In a further embodiment, the invention provides a deep-implanted layer positioned between the contact and the doped trenched layer, the deep-implanted layer having the same conductivity type as that of the trenched layer, but being more highly doped than the trenched layer.

In a further embodiment, the invention provides the deep-implanted layer (TI') which extends essentially over the entire trenched layer (BL').

In a further embodiment, the invention provides the contact (CC') which is connected, via a metallic connection (V), to the substrate terminal surface, the emitter terminal surface, or a connection surface between the two.

In a further embodiment, the invention provides a method for making a microwave device comprising a substrate; a transistor whose collector, base and emitter are respectively connected to a collector terminal surface (CPAD), a base terminal surface (BPAD) and an emitter terminal surface (EPAD); a substrate terminal surface, the emitter terminal surface being connected to a substrate terminal surface and electrical ground; and a highly doped trenched layer (BL') insulated from, but positioned underneath, the base terminal surface, the trenched layer being connected to ground via a contact (CC') located as closely as possible next to the base terminal surface comprising the steps of forming the trenched layer (BL') in common with a trenched layer (BL) of the transistor (T); forming the contact (CC') in common with a collector contact (CC) of the transistor; and forming the deep-implanted layer (TI') simultaneously in the same process as a deep-implanted layer (TI) between the collector contact of the transistor and the trenched layer of the transistor.

These and other features of the invention are discussed in greater detail below in the following detailed description of the presently preferred embodiments with reference to the accompanying drawings.

BRIEF DESCRIPTION OF THE DRAWINGS

FIG. 1 illustrates a top view of an embodiment of the invention.

FIG. 2 illustrates a sectional view of the embodiment of FIG. 1 taken along the line II—II.

DETAILED DESCRIPTION OF THE PRESENTLY PREFERRED EMBODIMENTS

In the present invention, the noise figure in a microwave device is reduced in a simple way in that under the base terminal surface of a microwave transistor, a low-ohmic trenched layer is placed into the substrate, which layer is connected, in the vicinity of the base terminal, to a reference potential via a standard collector contact. Since the noise figure of the overall arrangement depends not only on the actual active component, but also on the dimensioning of the elements of a parasitic RC element between the base terminal and the reference potential, the noise figure of the arrangement is lowered on the basis of a low-resistance ground connection of the capacitor of the parasitic RC element. Advantageously, a trenched layer, if warranted, a layer produced by deep implantation, and also the metallic connection of these layers to ground potential, can be formed in the same process as the layers between the collector and the collector terminal and the layer for the collector terminal itself.

FIG. 1 illustrates an arrangement or device with a microwave transistor T whose collector, base and emitter are respectively connected to a collector terminal surface CPAD, a base terminal surface BPAD and an emitter terminal surface EPAD. The emitter terminal surface is connected to a substrate terminal surface SUBPAD for contacting a substrate, and to electrical ground (GRD). In the lateral region of the base terminal surface, and expanded in the direction toward the substrate terminal surface SUBPAD, a lateral boundary line of a trenched layer BL' is indicated in the shape of a rectangle. Between the substrate terminal SUBPAD and the lateral region of the trenched layer BL', a web-type metal connection V is shown that extends up to inside the lateral region of the trenched layer and comprises a contact CC'. Finally, a section line II—II is drawn through the trenched layer BL', the base terminal BPAD, the contact CC', the connection V and the substrate terminal surface SUBPAD.

In FIG. 2, a section taken along the line II—II is shown. A parasitic capacitor C is illustrated in-between the base terminal surface BPAD and the trenched layer BL', which layer is separated from the base terminal surface e.g. by insulating layers ISO1 and ISO2. The trenched layer BL' is connected to the contact CC' either directly or via an additional deep-implanted layer TI'. The terminal, located in the trenched layer BL', of the parasitic capacitor C is connected to the contact CC' via a parasitic resistor R2, contact CC' representing the trenched layer BL or, respectively, the deep-implanted layer TI'. If the trenched layer BL' were not present, then the terminal, located in the trenched layer BL, of the parasitic capacitor C would be connected to the substrate surface SUBPAD via a significantly higher-ohmic parasitic resistor $R_1$, shown by way of broken lines.

Figure 5:
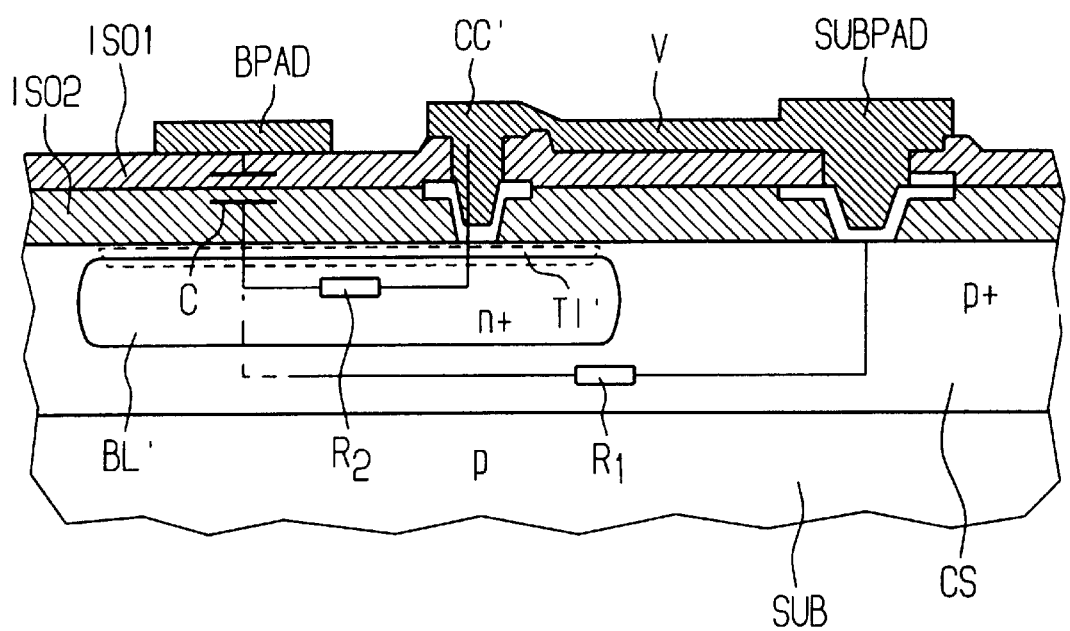
FIG. 5 illustrates the sectional view of FIG. 2, but with a larger deep implanted layer.

The layer resistance of the trenched layer BL' is typically approx. 20 to 40 $\Omega/\square$, and is thus typically lower by a factor of about 0.1 than the layer resistance of the substrate. If a deep-implanted layer TI extending over the entire trenched layer is additionally present, as illustrated in FIG. 5, an additional reduction of the resistance by a factor of approximately 0.5 can be achieved.

In known transistors, between the insulating layer ISO2 and the substrate SUB, there often is an additional layer called a channel stop layer CS, which is doped somewhat stronger than the substrate. The layer BL' is typically doped higher than the layer CS by a factor of about 100. In the illustrated embodiment, the layer BL' is n-conductive, whereas the channel stop layer CS and the substrate are p-conductive. Due to the essentially higher doping of the trenched layer and the greater proximity to the ground potential, the resistor $R_2$ has a lower resistance than that of the resistor of a conventional arrangement with a channel stop layer.

Figure 3:
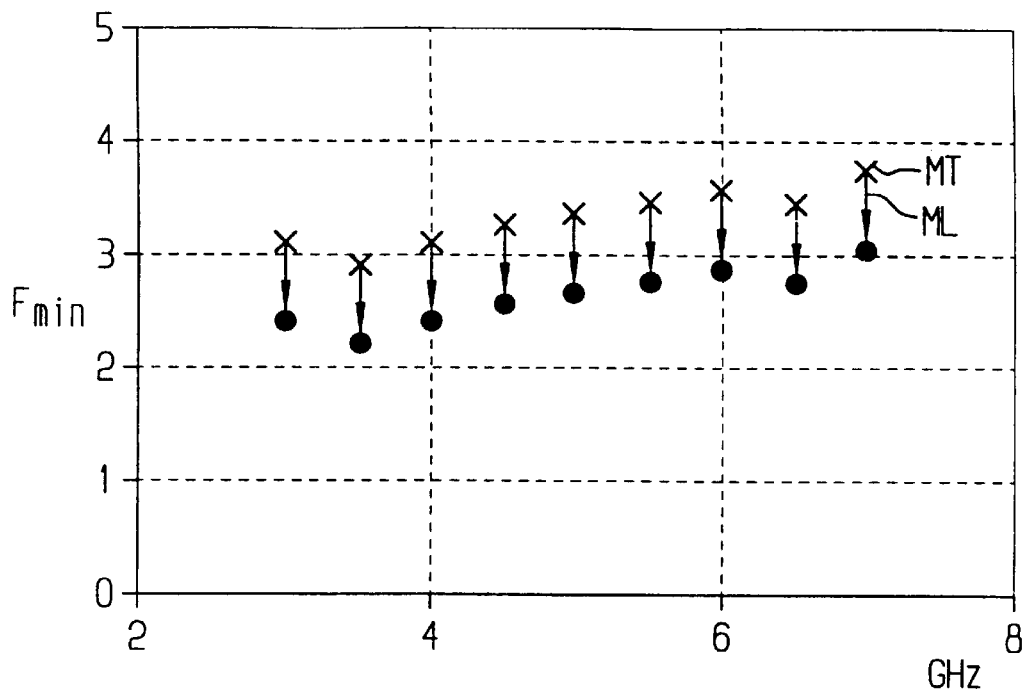
FIG. 3 illustrates a diagram that shows, for a standard arrangement with a microwave transistor, the influence of the substrate resistance on the minimum noise figure over a frequency range.

FIG. 3 illustrates the influence of the substrate resistance on the minimum noise figure on the basis of some measurement values plotted over a frequency f, whereby the minimum possible noise figure is respectively determined in that the noise figure of an arrangement with transistor T is reduced by the noise figure of a comparative test arrangement without a transistor T. From this, it is clear that the minimum noise figure $F_{min}$ can be reduced by about 0.5 at frequencies of about 3 GHz, and with increasing frequency can be reduced up to about 0.8 at a frequency of 7 GHz.

Figure 4:
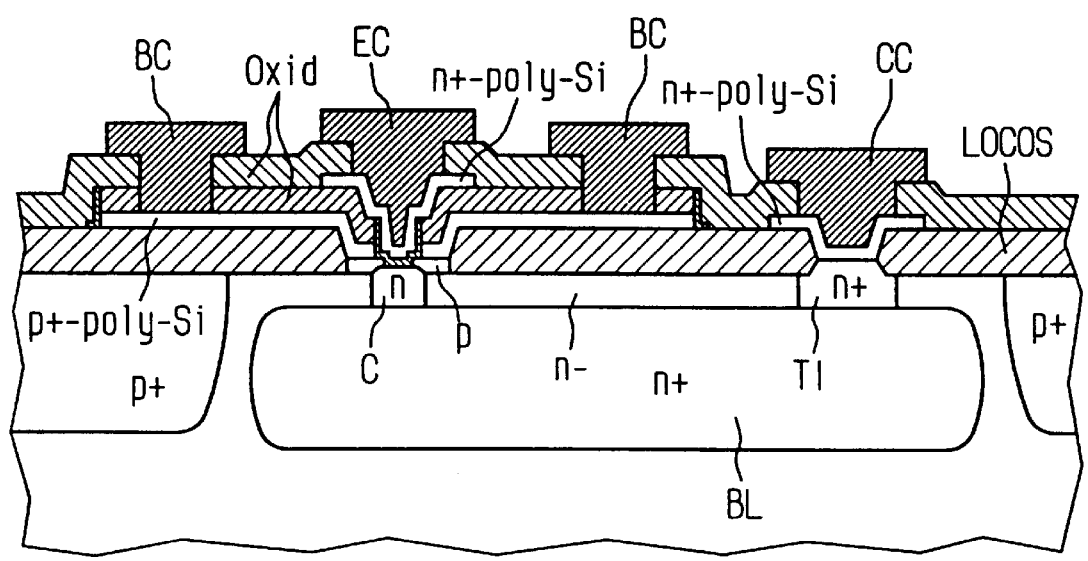
FIG. 4 illustrates a sectional view of a standard microwave transistor for the explanation of the manufacturing method.

FIG. 4 illustrates a section through a standard microwave transistor with the contacting of a collector C via a trenched layer BL and a deep-implanted layer TI with the collector contact CC. From FIG. 4, taking into consideration FIG. 2, it is clear that the trenched layer BL', the deep-implanted layer TI' and the contact CC' can be produced simultaneously, in a cost-saving manner, in a standard process for the contacting of the collector. Objects in common differ in their reference characters by a stroke or prime mark.

Although modifications and changes may be suggested by those skilled in the art, it is the intention of the inventors to embody within the patent warranted hereon all changes and modifications as reasonably and properly come within the scope of their contribution to the art.

What is claimed is:

1. A microwave device, comprising:
   a substrate;
   a transistor whose collector, base and emitter are respectively connected to a collector terminal pad, a base terminal pad and an emitter terminal pad, said pads being in spaced apart relationship across an upper surface of said substrate;
   a substrate terminal pad also on said substrate surface, the emitter terminal pad being connected to the substrate terminal pad and electrical ground; and
   a highly doped trenched layer, insulated from, but positioned underneath, the base terminal pad, the trenched layer being connected to electrical ground via a contact located over said trenched layer, the contact and the trenched layer being interconnected by means of a deep implanted layer positioned between the trenched layer and the contact.

2. The device of claim 1 in which the deep-implanted layer extends essentially over the entire trenched layer.

3. The device of any one of claims 1 and 2 in which the contact is connected, via a metallic connection, to the substrate terminal surface, the emitter terminal surface, or a connection surface between the two.

4. The device of one of claims 1 and 2 further comprising a parasitic resistance provided by the trenched layer between the base pad and the contact.

5. A microwave device, comprising:
   a substrate;
   a transistor whose collector, base and emitter are respectively connected to a collector terminal surface, a base terminal surface and an emitter terminal surface;
   a substrate terminal surface, the emitter terminal surface being connected to the substrate terminal surface and electrical ground;
   a highly doped trenched layer, insulated from, but positioned underneath, the base terminal surface, the trenched layer being connected to electrical ground via a contact located as closely as possible next to the base terminal surface; and a deep-implanted layer positioned between the contact and the trenched layer, the deep-implanted layer having the same conductivity type as that of the trenched layer, but being more highly doped than the trenched layer.

6. The device of claim 5 in which the deep-implanted layer extends essentially over the entire trenched layer.

7. The device of one of claims 5 and 6 further comprising a parasitic capacitance between the base surface and the trenched layer.

8. The device of one of claims 5 and 6 further comprising a parasitic resistance provided by the trenched layer between the base terminal surface and the contact.

9. The device of one of claims 1 and 2 further comprising a parasitic capacitance between the base pad and the trenched layer.

10. The device of claim 4, wherein the parasitic resistance is less than a factor of 0.1 of a layer resistance of the substrate.

11. The device of claim 4 further comprising a parasitic capacitance between the base pad and the trenched layer.

12. The device of claim 8, wherein the parasitic resistance is less than a factor of 0.1 of a layer resistance of the substrate.

13. The device of claim 8 further comprising a parasitic capacitance between the base surface and the trenched layer.

* * * * *